(12) United States Patent
Takei

(10) Patent No.: US 7,538,549 B2
(45) Date of Patent: May 26, 2009

(54) MAGNETIC RESONANCE IMAGING APPARATUS, MAGNETIC RESONANCE IMAGING METHOD AND PROGRAM THEREFOR

(75) Inventor: Naoyuki Takei, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 12/016,542

(22) Filed: Jan. 18, 2008

(65) Prior Publication Data

US 2008/0180098 A1    Jul. 31, 2008

(30) Foreign Application Priority Data

Jan. 25, 2007    (JP)    ............... 2007-015272

(51) Int. Cl.
*G01V 3/00*    (2006.01)
(52) U.S. Cl. ........................ 324/307; 324/309
(58) Field of Classification Search ......... 324/300–322; 600/407–445
See application file for complete search history.

(56) References Cited

U.S. PATENT DOCUMENTS

| 4,710,717 | A | 12/1987 | Pelc et al. |
|---|---|---|---|
| 6,539,074 | B1 | 3/2003 | Yavuz et al. |
| 6,798,199 | B2 | 9/2004 | Larson et al. |
| 6,961,455 | B2 | 11/2005 | Ma et al. |
| 7,030,609 | B2 * | 4/2006 | Pipe ............................ 324/309 |
| 7,205,763 | B2 * | 4/2007 | Porter ......................... 324/306 |
| 7,323,873 | B2 * | 1/2008 | Yamazaki .................... 324/309 |
| 2004/0155653 | A1 | 8/2004 | Larson et al. |
| 2006/0264735 | A1 * | 11/2006 | Stemmer .................... 600/410 |
| 2008/0129289 | A1 * | 6/2008 | Stemmer et al. ............ 324/309 |
| 2008/0169808 | A1 * | 7/2008 | Taniguchi et al. ........... 324/307 |

FOREIGN PATENT DOCUMENTS

JP    2004-237109    8/2004

OTHER PUBLICATIONS

James G. Pipe, "Motion Correction with Propeller MRI: Application to Head Motion and Free-Breathing Cardiac Imaging," Magnetic Resonance in Medicine, 42:963-969 (1999).

* cited by examiner

*Primary Examiner*—Brij B Shrivastav
(74) *Attorney, Agent, or Firm*—Armstrong Teasdale LLP

(57) ABSTRACT

A magnetic resonance imaging method includes the steps of performing a scan for collecting magnetic resonance signals from a subject in an imaging space where a magnetostatic field is formed, so as to match the PROPELLER method, wherein in executing the scan by the PROPELLER method, a reversed pulse is transmitted to the subject when the magnetic resonance signals are to be so collected successively at every repetition time as to match a blade including a plurality of trajectories and the magnetic resonance signals are successively collected by executing a pulse sequence matching the GRE method after the time of reversal has elapsed.

20 Claims, 5 Drawing Sheets

(A)

(B)

MAGNETIC RESONANCE IMAGING APPARATUS, MAGNETIC RESONANCE IMAGING METHOD AND PROGRAM THEREFOR

CROSS REFERENCE TO RELATED APPLICATIONS

This application claims the benefit of Japanese Patent Application No. 2007-15272 filed Jan. 25, 2007.

BACKGROUND OF THE INVENTION

The field of the present invention relates to a magnetic resonance imaging apparatus, a scanning device, a magnetic resonance imaging method and a program therefor, and more particularly to a magnetic resonance imaging apparatus which so executes a scan to collect magnetic resonance signals from a subject in an imaging space wherein a magnetostatic field is formed as to match the PROPELLER (Periodically Rotated Overlapping Parallel Lines with Enhanced Reconstruction) method and generates an image of the subject on the basis of the magnetic resonance signals obtained by the execution of the scan, a scanning device and a magnetic resonance imaging method by which that scan is executed, and a program therefor.

A magnetic resonance imaging (MRI: Magnetic Resonance Imaging) apparatus is known as an apparatus that picks up images of a subject by utilizing the nuclear magnetic resonance (NMR: Nuclear Magnetic Resonance) phenomenon, and is used in medical, industrial and many other fields.

When a subject is to be imaged by using a magnetic resonance imaging apparatus, first the subject is accommodated in the imaging space wherein a magnetostatic field is formed, and the spinning directions of protons in the subject are aligned with the direction of the magnetostatic field to achieve a state in which a magnetization vector is obtained. After that, the magnetization vector of the protons in the subject is flipped by irradiating the subject with an RF pulse, which is an electromagnetic wave of the resonance frequency, from an RF coil and thereby causing a phenomenon of nuclear magnetic resonance to arise. The magnetic resonance imaging apparatus then returns to the original magnetization vector. Magnetic resonance signals deriving from the protons in the subject are received by the RF coil. On the basis of the received magnetic resonance signals, for instance, a sliced image is generated regarding a sliced plane of the subject.

If a bodily movement of the subject occurs here when executing the scan to collect magnetic resonance signals from the subject, a bodily movement artifact may arise in the image generated as described above. For instance, a bodily movement artifact may occur in the phase encode direction and invite a trouble of deteriorated image quality. This trouble is mainly attributable to sampling of magnetic resonance signals at every time of repetition (TR) in the frequency encode direction of the k space to successively match the matrix in the phase encode direction of the k space.

The PROPELLER method is known as a method of restraining the occurrence of such bodily movement artifacts.

The PROPELLER method is a method of so sampling magnetic resonance signals required for image reconstruction as to match the k space by turning a strip-shaped blade in the central part of the k space. Thus, it is a sampling method to which the concept of phase encode is applied among methods of radially sampling magnetic resonance signals matching the k space. More specifically, by performing the action to so collect repetitively the magnetic resonance signals as to match a blade containing a plurality of trajectories in each of the positions to which the blade is successively turned around the center of the k space at intervals, the magnetic resonance signals are so sampled as to match each matrix of the k space.

As this method is to scan regions of a k space whose central part is the same as the k space at the time of collecting divided sets of data, the data can be used as two-dimensional navigator data, and accordingly accurate compensations for bodily movements can be achieved. Since magnetic resonance signals matching the low frequency region in the k space are successively collected in duplication, the bodily movements of the subject can be detected on the basis of each of the magnetic resonance signals collected in duplication. As a result, as the bodily movements can be compensated for by using this result, the image quality can be enhanced (see Patent Document 1 and Non-Patent Document 1 for instance).

Patent Document 1. Japanese Unexamined Patent Publication No. 2004-237109.

Non-Patent Document 1. Magnetic Resonance in Medicine 42:963-969, 1999, James G. Pipe, Motion Correction with PROPELLER MRI: Application to Head Motion and Free-Breathing Cardiac Imaging.

In sampling by this PROPELLER method, as high speed data collection is required to prevent any blade, usually magnetic resonance signals are so collected repetitively as to match the trajectories of each blade by the FSE (fast spin echo) method. For instance at 160 to 200 ms intervals, magnetic resonance signals are collected. This FSE method, as it gives a T2 effect by increasing the number of echo trains, enables an appropriate T2 emphasized image to be generated.

However, in order to prevent a T2 effect to arise when a T1 emphasized image is to be generated in this process, it is difficult to increase the number of echo trains. Accordingly, effective collection of many magnetic resonance signals is made difficult, and high speed data collection may become difficult to achieve.

Along with that, it is also made difficult to collect many data for compensation for bodily movements, possibly resulting in difficulty of effectively correcting bodily movement artifacts and to generate a T1 emphasized image of high image quality.

Since high speed data collection cannot be easily accomplished in sampling by the PROPELLER method when the FSE method is applied, it is difficult to appropriately compensate for bodily movements and to generate a T1 emphasized image of high image quality.

SUMMARY OF THE INVENTION

It is desirable that the problems described previously are solved.

In one aspect of the invention, a magnetic resonance imaging apparatus includes a scanning unit which executes a scan for collecting magnetic resonance signals from a subject in an imaging space where a magnetostatic field is formed, as to match the PROPELLER method, the magnetic resonance imaging apparatus generating an image of the subject on the basis of the magnetic resonance signals obtained by the execution of the scan by the scanning unit, wherein the scanning unit, in executing the scan by the PROPELLER method, transmits a reversed pulse to the subject when the magnetic resonance signals are to be so collected successively at every repetition time as to match a blade including a plurality of trajectories and successively collects the magnetic resonance signals by executing a pulse sequence matching the GRE method after the time of reversal has elapsed.

Preferably, any bodily movement of the subject may be detected on the basis of magnetic resonance signals collected by the scanning unit.

Preferably, any bodily movement of the subject may be detected by the execution of the scan by the scanning unit on the basis of each of magnetic resonance signals so collected successively as to match the low frequency region in a k space.

Preferably, the image may be corrected on the basis of the result of detection of the bodily movement.

Preferably, a T1 emphasized image may be generated as an image of the subject.

Preferably, the apparatus may have a display unit for displaying the image.

In another aspect of the invention, a scanning device executes a scan for collecting magnetic resonance signals from a subject in an imaging space where a magnetostatic field is formed, so as to match the PROPELLER method; the device, in executing the scan by the PROPELLER method, transmits a reversed pulse to the subject when the magnetic resonance signals are to be so collected successively at every repetition time as to match a blade including a plurality of trajectories and successively collects the magnetic resonance signals by executing a pulse sequence matching the GRE method after the time of reversal has elapsed.

In another aspect of the invention, a magnetic resonance imaging method includes the steps of: performing a scan for collecting magnetic resonance signals from a subject in an imaging space where a magnetostatic field is formed, so as to match the PROPELLER method, wherein, in executing the scan by the PROPELLER method, a reversed pulse is transmitted to the subject when the magnetic resonance signals are to be so collected successively at every repetition time as to match a blade including a plurality of trajectories and the magnetic resonance signals are successively collected by executing a pulse sequence matching the GRE method after the time of reversal has elapsed.

Preferably, any bodily movement of the subject may be detected on the basis of magnetic resonance signals collected by the scanning unit.

Preferably, any bodily movement of the subject may be detected by the execution of the scan on the basis of each of magnetic resonance signals so collected successively as to match the low frequency region in a k space.

Preferably, the image may be corrected on the basis of the result of detection of the bodily movement.

Preferably, a T1 emphasized image may be generated as an image of the subject.

Preferably, the image may be displayed.

In another aspect of the invention, a program causes a computer to function to execute a scan to collect magnetic resonance signals from a subject in an imaging space where a magnetostatic field is so formed as to match the PROPELLER method, and to generate an image of the subject on the basis of the magnetic resonance signals obtained by the execution of the scan, whereby, in executing the scan by the PROPELLER method, a reversed pulse is transmitted to the subject when the magnetic resonance signals are to be so collected successively at every repetition time as to match a blade including a plurality of trajectories and the magnetic resonance signals are successively collected to cause a pulse sequence matching the GRE method to be executed after the time of reversal has elapsed.

Preferably, the computer may be caused to function to detect any bodily movement of the subject on the basis of the collected magnetic resonance signals.

Preferably, the computer may be caused to function to detect any bodily movement of the subject by the execution of the scan on the basis of each of magnetic resonance signals so collected successively as to match the low frequency region in a k space.

Preferably, the computer may be caused to function to correct the image on the basis of the result of detection of the bodily movement.

According to the invention, it is possible to provide a magnetic resonance imaging apparatus, a scanning device and a magnetic resonance imaging method that enable the efficiency of diagnosis to be enhanced by realizing high speed data collection and making achievable high image quality, and a program therefor.

Further objects and advantages of the present invention will be apparent from the following description of the preferred embodiments of the invention as illustrated in the accompanying drawings.

DETAILED DESCRIPTION OF THE INVENTION

The best modes for carrying out the invention will be described in detail with reference to drawings.

(Hardware Configuration)

Figure 1:
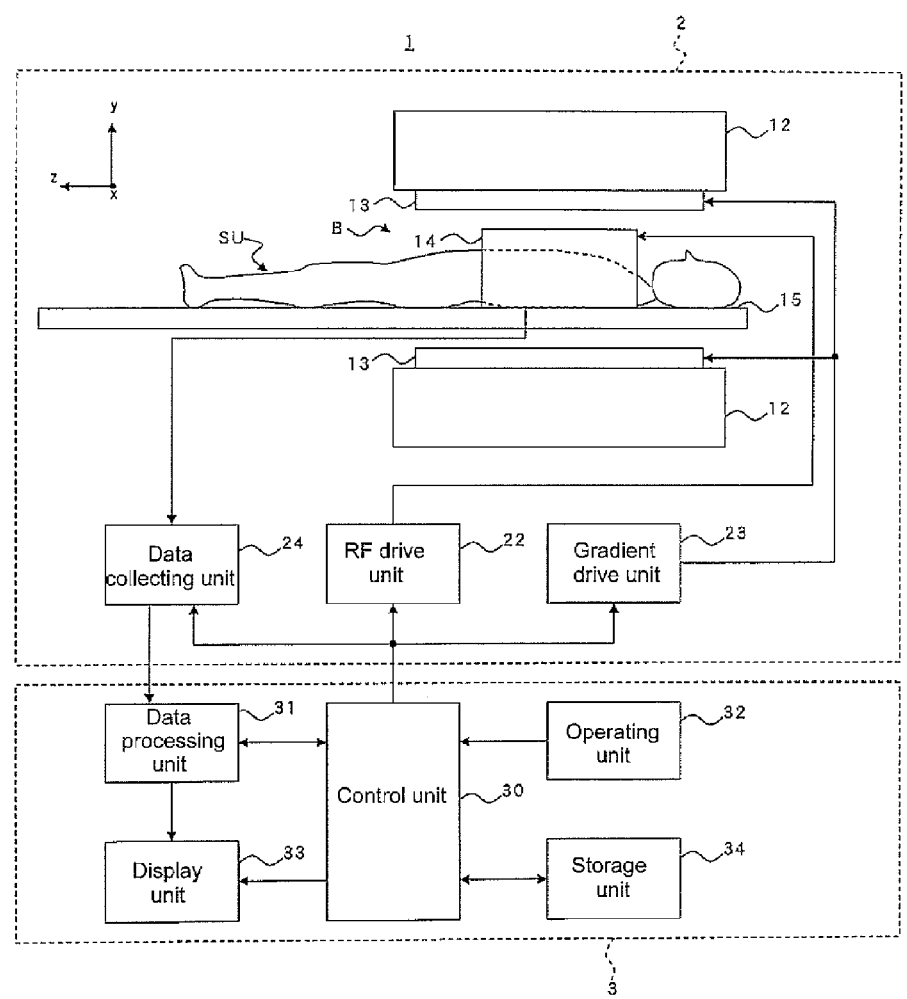
FIG. 1 is a diagram showing the configuration of the magnetic resonance imaging apparatus 1 in a mode for implementing the invention.

FIG. 1 is a diagram showing the configuration of a magnetic resonance imaging apparatus 1 in a mode for implementing the invention.

As shown in FIG. 1, the magnetic resonance imaging apparatus 1 has a scanning unit 2 and an operating console unit 3; it executes a scan to collect magnetic resonance signals from a subject in an imaging space wherein a magnetostatic field is formed, and generates an image of the subject on the basis of the magnetic resonance signals obtained by the execution of the scan.

Individual units therein will be described successively.

The scanning unit 2 will be described.

The scanning unit 2, having a magnetostatic field magnet unit 12, a gradient coil unit 13, an RF coil unit 14, an RF drive unit 22, a gradient drive unit 23, a data collecting unit 24 and a cradle 15 as shown in FIG. 1, so executes a scan to collect magnetic resonance signals from a subject in an imaging space B, wherein a magnetostatic field is formed, as to match the PROPELLER method. Thus, the scanning unit 2 so executes the scan with a blade comprising a plurality of trajectories that are parallel in the radial direction from the origin in a k space as to successively collect a plurality of magnetic resonance signals at every repetition time as to match the plurality of trajectories. And it repeats a plurality of times the execution of the scan for each such blade in successive positions to which the blade is successively turned around the center of the k space.

While details will be described afterwards, the scanning unit 2 in this mode for implementation, in executing the scan by the PROPELLER method, transmits a reversed pulse to the subject when the magnetic resonance signals are to be so collected successively at every repetition time as to match the blade including a plurality of trajectories and, after the time of reversal has elapsed, successively collects the magnetic resonance signals by successively transmitting RF pulses and gradient pulses in a pulse sequence matching the GRE (Gradient Recalled Echo) method.

Constituent elements of the scanning unit 3 will be described successively.

The magnetostatic field magnet unit 12 is a horizontal magnetic field type one for instance, and its superconducting magnet (not shown) so forms a magnetostatic field as to be in the body axis direction (z direction) of a subject SU in the imaging space B in which the subject SU is placed. Incidentally, the magnetostatic field magnet unit 12 may as well be, instead of a horizontal magnetic field type, a vertical magnetic field type or a pair of permanent magnets constituting a magnetostatic field in the direction of their opposing each other.

The gradient coil unit 13, which forms a gradient magnetic field in the imaging space B in which a magnetostatic field is formed, adds spatial position information received by the RF coil unit 14. The gradient coil unit 13 here comprises three lines to be adaptable to three mutually orthogonal axial directions including the z direction in the direction of the magnetostatic field, the x direction and the y direction. They form gradient magnetic fields by transmitting gradient pulses in the frequency encode direction, the phase encode direction and the slice selecting direction according to the set imaging conditions. More specifically, the gradient coil unit 13 applies gradient magnetic fields in the slice selecting direction of the subject SU, and selects a slice of subject SU excited by the transmission of RF pulses by the RF coil unit 14. The gradient coil unit 13 applies gradient magnetic fields in the phase encode direction of the subject SU to phase-encode magnetic resonance signals from the slice excited by RF pulses. Then, the gradient coil unit 13 applies gradient magnetic fields in the frequency encode direction of the subject SU to frequency-encode magnetic resonance signals from the slice excited by RF pulses.

The RF coil unit 14 is so arranged as to surround the subject SU as shown in FIG. 1. The RF coil unit 14 forms high frequency magnetic fields by transmitting RF pulses, which are electromagnetic waves, to the subject SU in the imaging space B in which a magnetostatic field is formed by the magnetostatic field magnet unit 12 and thereby excites the spinning of protons in the imaging area of the subject SU. Then, the RF coil unit 14 receives as magnetic resonance signals electromagnetic waves generated from the excited protons in the subject SU.

The cradle 15 has a table on which the subject SU is to be mounted. The cradle 15 moves between inside and outside the imaging space B in accordance with control signals from a control unit 30.

The RF drive unit 22, by having the RF coil unit 14 driven, causes RF pulses to be transmitted into the imaging space B to form a high frequency magnetic field. The RF drive unit 22, after modulating signals from an RF oscillator with a gate modulator into signals of a prescribed timing and a prescribed envelope in accordance with control signals from the control unit 30, amplifies the signals modulated by the gate modulator with an RF power amplifier, and outputs the signals to the RF coil unit 14 to have RF pulses transmitted.

The gradient drive unit 23 applies gradient pulses to the gradient coil unit 13 in accordance with control signals from the control unit 30 to drive it, and causes gradient magnetic fields to be generated in the imaging space B in which a magnetostatic field is formed. The gradient drive unit 23 has three lines of drive circuits (not shown) matching the three line gradient coil unit 13.

The data collecting unit 24 collects, in accordance with control signals from the control unit 30, magnetic resonance signals received by the RF coil unit 14. In the data collecting unit 24 here, a phase detector detects the phases of the magnetic resonance signals received by the RF coil unit 14 with the output of the RF oscillator of the RF drive unit 22 as the reference signal. After that, it converts these magnetic resonance signals, which are analog signals, into digital signals by using an A/D converter, and outputs the digital signals.

The operating console unit 3 will be described.

The operating console unit 3, having the control unit 30, a data processing unit 31, an operating unit 32, a display unit 33 and a storage unit 34 as shown in FIG. 1, performs control to have the scanning unit 2 execute a scan in accordance with the PROPELLER method, generates image of the subject SU on the basis of the magnetic resonance signals obtained by the scan executed by the scanning unit 2 and displays the generated image.

Constituent elements of the operating console unit 3 will be described successively.

The control unit 30, having a computer and a memory for storing a program to have the computer execute prescribed data processing, controls various units. Operational data from the operating unit 32 are inputted to the control unit 30 here and, on the basis of the operational data from the operating unit 32, control signals are outputted to each of the RF drive unit 22, the gradient drive unit 23 and the data collecting unit 24 to cause a prescribed scan to be executed. At the same time, it outputs control signals to the data processing unit 31, the display unit 33 and the storage unit 34 to perform control.

In this mode for implementation as described above, there is stored a program to cause the computer to so function as to have the scanning unit 2, in executing the scan by the PROPELLER method, transmit a reversed pulse to the subject when magnetic resonance signals are to be so collected successively at every repetition time TR as to match the blade including a plurality of trajectories and, after the time of reversal has elapsed, successively collect the magnetic resonance signals by successively transmitting RF pulses and gradient pulses in a pulse sequence matching the GRE method, and the computer executes this function using this program. There also is stored a program to cause the computer to so function as to have the data processing unit 31 detect any bodily movement of the subject on the basis of the magnetic resonance signals collected by the scanning unit 2, and the computer executes this function using this program. There further is stored a program to cause the computer to so function as to correct on the basis of the detected bodily movement the image generated as described above, and the computer executes this function using this program.

The data processing unit 31, having a computer and a memory for storing a program to have the computer execute prescribed data processing, executes data processing in accordance with control signals from the control unit 30 to generate an image. The data processing unit 31 here is connected to the data collecting unit 24, acquires magnetic resonance signals collected by the data collecting unit 24, and subjects the collected magnetic resonance signals to image processing to generate an image regarding a slice of the subject SU. Then, the data processing unit 31 outputs the generated image to the display unit 33.

In this mode for implementation, the data processing unit 31 reconstructs and generates the image of the subject by, for instance, subjecting the magnetic resonance signals to gridding. Thus, it reconstructs the image of the subject by performing Fourier transform after converting the magnetic resonance signals radially obtained in the k space into magnetic resonance signals arrayed in a matrix form by interpolation. The image of the subject here is generated as a T1 emphasized image. Incidentally, the image of the subject may as well be reconstructed and generates by processing back projection.

Further in this mode for implementation, the data processing unit 31 detects any bodily movement of the subject on the basis of the magnetic resonance signals collected by the scanning unit 2. The bodily movement of the subject is detected on the basis of each of the magnetic resonance signals so collected successively as to match the low frequency region in the k space by the execution of a scan by the scanning unit 2 following the method described in the references cited above for instance. After that, on the basis of the detected bodily movement, the image generated as described above is corrected.

The operating unit 32 is composed of operating devices such as a keyboard and a pointing device. Operational data are inputted by an operator to the operating unit 32, which outputs the operational data to the control unit 30.

The display unit 33, composed of a display device such as a CRT, displays an image on its display screen in accordance with control signals from the control unit 30. For instance, the display unit 33 displays on the display screen a plurality of images regarding input items regarding which operational data are inputted to the operating unit 32 by the operator. The display unit 33, receiving from the data processing unit 31 data regarding the image of the subject SU generated on the basis of magnetic resonance signals from the subject SU, displays the image on the display screen.

The storage unit 34, composed of a storage device such as a memory, stores various data. The data stored in the storage unit 34 are accessed by the control unit 30 as required.

(Operation)

The operation that is performed in imaging a slice of the subject SU by using the magnetic resonance imaging apparatus 1 in the above-described mode for implementing the invention will be described below.

Figure 2:
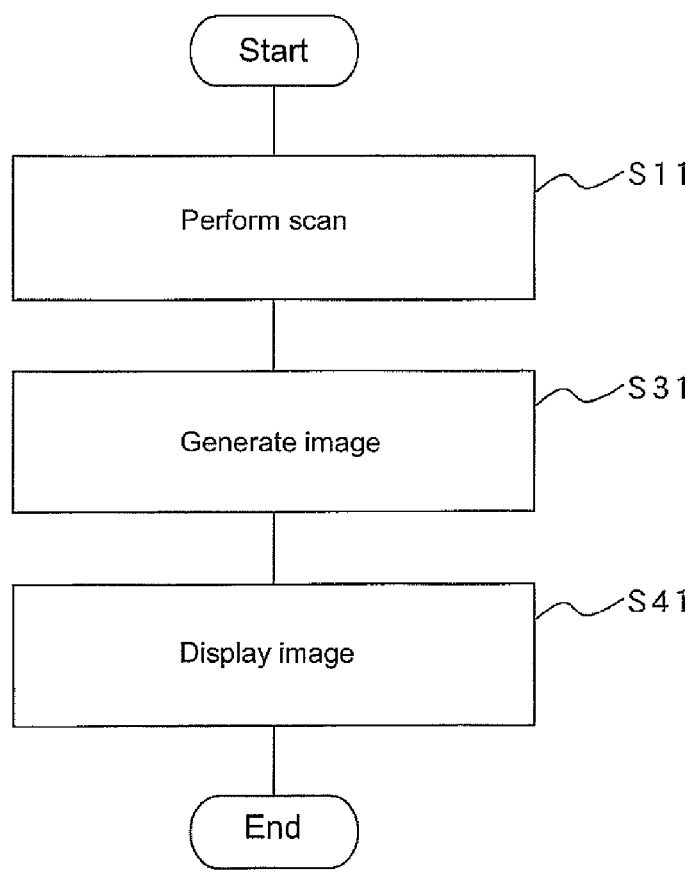
FIG. 2 is a flow chart of the operation that is performed in imaging a slice of the subject SU in the mode for implementing the invention.

FIG. 2 is a flow chart of the operation that is performed in imaging a slice of the subject SU in this mode for implementing the invention.

When imaging a slice of the subject SU, after first mounting the subject SU on the cradle 15, the RF coil unit 14 is so positioned as to match the imaging area of the subject SU. Then, the control unit 30 so performs control as to move the cradle 15 on which the subject SU is mounted into the imaging space B in which a magnetostatic field is formed.

Then, a scan is performed as charted in FIG. 2 (S11).

Here, in accordance with a starting instruction to start a scan inputted by the operator to the operating unit 32 of the operating console unit 3, the scanning unit 2 starts scanning. In this mode for implementation, a scan to collect magnetic resonance signals from the subject in the imaging space B in which a magnetostatic field is formed is performed in accordance with the PROPELLER method.

FIGS. 3(a) to 3(d) are diagrams illustrating the operation by the scanning unit 2 to so sample magnetic resonance signals as to match a k space ks in this mode for implementing the invention. FIG. 3 show in the order of (a), (b), (c) and (d) the operation of the scanning unit 2 so sample magnetic resonance signals as to match the k space ks.

Figure 3:
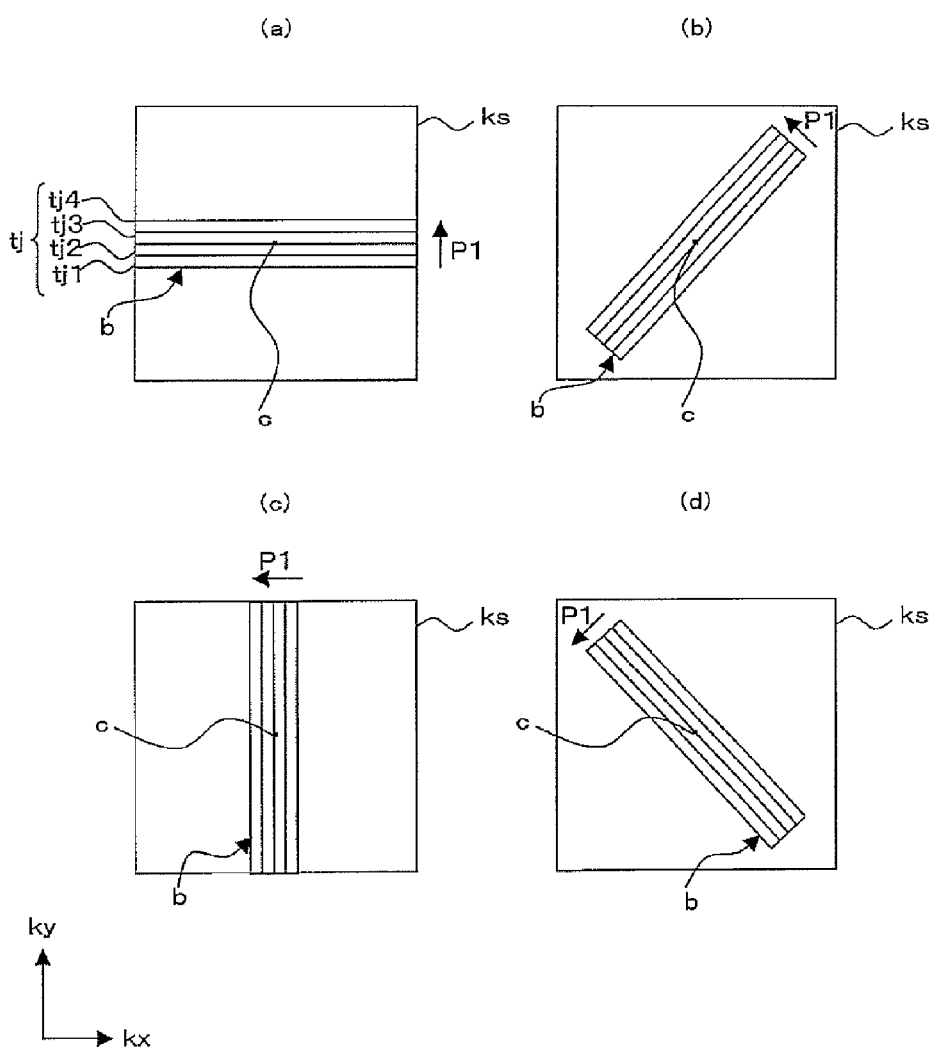
FIGS. 3(a), 3(b), 3(c), and 3(d) are diagrams illustrating the operation by the scanning unit 2 to so sample magnetic resonance signals as to match a the k space ks in this mode for implementing the invention.

As shown in FIG. 3, a blade b comprising a plurality of trajectories tj, parallel from the origin c in the radial direction 4 in the k space ks, is arranged in the central part of the k space ks, and the scanning unit 2 so executes a scan as to successively collect at repetition times TR a plurality of magnetic resonance signals matching the plurality of trajectories tj contained in the blade b. Then, this scan regarding the blade b is repeated a plurality of times in successive positions to which the blade b is successively turned around the center c of the k space ks.

Here, as shown in each of FIG. 3(a) through 3(d), a scan to obtain at every repetition time TR in a prescribed trajectory sequence P1, for instance, magnetic resonance signals matching the plurality of trajectories tj in the blade b of the k space is successively executed in each of the positions to which the blade b is successively turned counterclockwise around the origin c of the k space ks. Incidentally, though FIGS. 3(a) through 3(d) illustrate a case in which this scan is executed in four positions of the blade b, but the operation is not limited to this case.

In this mode for implementation, first a scan is so executed as to obtain a plurality of magnetic resonance signals matching the blade b comprising a plurality of trajectories tj arrayed along the frequency encode direction kx of the k space ks and arranged via the center in the phase encode direction ky of the k space ks as shown in FIG. 3(a).

Figure 4:
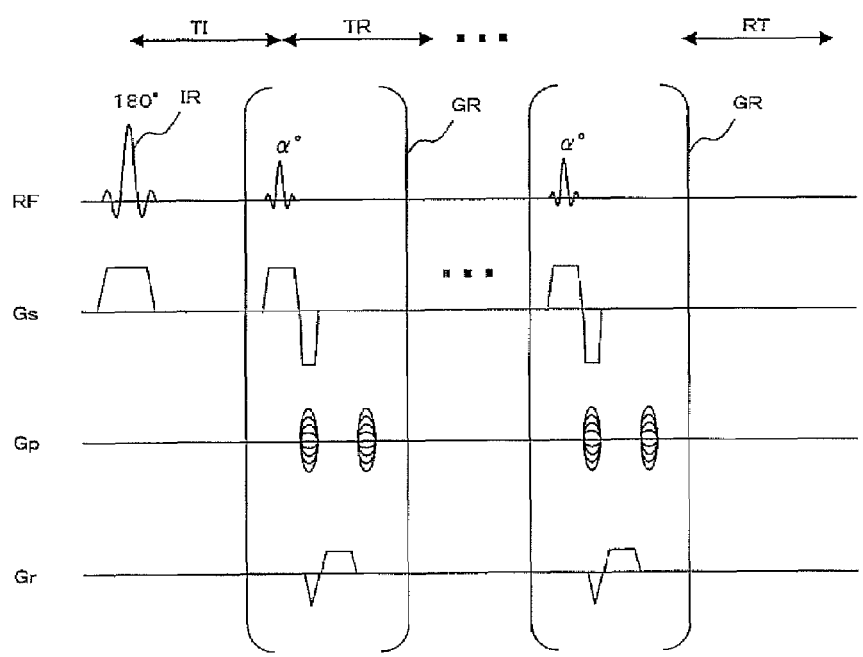
FIG. 4 is a diagram of a pulse sequence where a scan is to be executed for one blade in this mode for implementing the invention.

FIG. 4 is a diagram of a pulse sequence where a scan is to be executed for one blade in this mode for implementing the invention. FIG. 4 shows an RF pulse RF, a gradient magnetic field Gs in the slice selecting direction, a gradient magnetic field Gp in the phase encode direction and a gradient magnetic field Gr in the frequency encode direction. Incidentally, the vertical axis represents the intensity and the horizontal axis, the time.

In executing a scan by the PROPELLER method, when magnetic resonance signals are to be so collected successively at every repetition time TR as to match the plurality of trajectories contained in the blade, the magnetic resonance signals are successively collected by transmitting a reversed pulse IR to the subject and, after a reversal time T1 has elapsed, transmitting the RF pulse and the gradient pulse in a pulse sequence GR matching the GRE method as shown in FIG. 4. Thus, first the reversed pulse IR whose flip angle is 180° is so transmitted as to select the imaging area for the subject. Then, when a prescribed reversal time T1 has elapsed after that transmission, each of the magnetic resonance signals respectively matching the trajectories of the blade b are successively collected by so transmitting repetitively RF pulses whose flip angle is α° as to match a so-called GRASS (gradient recalled acquisition in the steady state) sequence.

Here, as shown in FIG. 3(a) for instance, this scan is executed by so adjusting the transmission of gradient pulses in the frequency encode direction and that of gradient pulses in the phase encode direction in FIG. 4 as to obtain magnetic resonance signals respectively matching the trajectories tj at every repetition time TR in a trajectory sequence P1 from a first trajectory tj1 positioned at one end of the blade b to a fourth trajectory tj4 position at the other end from the first trajectory tj1. Thus, in the trajectory sequence P1 of the first trajectory tj1, a second trajectory tj2, a third trajectory tj3 and the fourth trajectory tj4, magnetic resonance signals matching the TR trajectories tj are obtained at every repetition time.

Next, as shown in FIG. 4, after the collection of the magnetic resonance signals in the above-noted blade positions, when a prescribed recovery time RT has elapsed, a scan is executed to obtain a plurality of magnetic resonance signals matching the blade b comprising a plurality of trajectories tj arrayed in a direction turned 45° counterclockwise around the origin c of the k space ks relative to the frequency encode direction kx of the k space ks as shown in FIG. 3(b).

Here again, as in the above-described case, magnetic resonance signals are successively collected by transmitting the reversed pulse IR to the subject and, after the elapse of the reversal time T1, transmitting the RF pulse and the gradient pulses in the pulse sequence GR matching the GRE method.

Next, a scan is executed in the same way as described to obtain a plurality of magnetic resonance signals matching the blade b comprising a plurality of trajectories tj arrayed in a direction turned 90° counterclockwise around the origin c of the k space ks relative to the frequency encode direction kx of the k space ks as shown in FIG. 3(c).

Then, a scan is executed in the same way as described to obtain a plurality of magnetic resonance signals matching the blade b comprising a plurality of trajectories tj arrayed in a direction turned 135° counterclockwise around the origin c of the k space ks relative to the frequency encode direction kx of the k space ks as shown in FIG. 3(d).

In the process described above, the scanning unit 2 acquires magnetic resonance signals by so executing scans as to match the PROPELLER method.

Next, an image is generated as charted in FIG. 2 (S31).

Here, the data processing unit 31 reconstructs and generates an image of the subject by, for instance, by gridding the magnetic resonance signals collected as described above. More specifically, it converts the magnetic resonance signals radially obtained in the k space into magnetic resonance signals so arrayed in a matrix form by interpolation as to match the matrix in the k space. After that, by subjecting those magnetic resonance signals to Fourier transform, the image of the subject is reconstructed. The image of the subject here is generated as a T1 emphasized image.

Here, any bodily movement of the subject is also detected on the basis of the magnetic resonance signals collected by the scanning unit 2. For instance, the bodily movement of the subject is detected on the basis of each of the magnetic resonance signals so collected successively as to match the low frequency region in the k space by the execution of a scan by the scanning unit 2 following the method described in the references cited above for instance. Thus, the presence or absence of any bodily movement is determined from variations of the image, obtained on the basis of the magnetic resonance signals so successively collected as to match the low frequency region in the k space, in signal intensity and contrast. For instance, if the signal intensity is not found within a predetermined threshold range, it is determined that a bodily movement has occurred. After that, on the basis of the detected bodily movement, the image generated as described above is corrected. For instance, magnetic resonance signals collected when any bodily movement occurred are not used as raw data for the image, and magnetic resonance signals collected when no bodily movement occurred are used as raw data for the image, and the aforementioned image is reconstructed and generated. Incidentally, bodily movement correction may be accomplished by some other appropriate method.

Next, the image is displayed as charted in FIG. 2 (S41).

Here, the image of the subject generated by the data processing unit 31 is displayed by the display unit 33 on its display screen.

As hitherto described, in this mode for implementation, in executing a scan by the PROPELLER method, when magnetic resonance signals are to be so collected successively at every repetition time TR as to match the blade containing a plurality of trajectories, the magnetic resonance signals are successively collected by transmitting a reversed pulse IR to the subject and, after the reversal time T1 has elapsed following that transmission, the pulse sequence GR matching the GRE method is executed.

Figure 5:
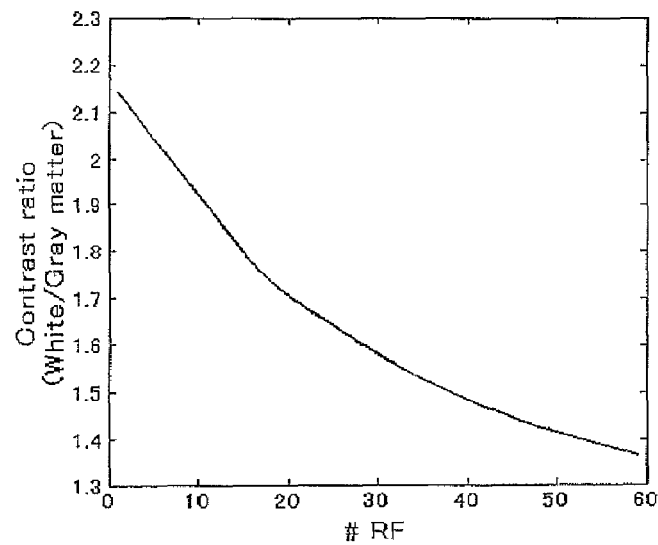
FIGS. 5(A) and 5(B) are diagrams showing the results of simulation executed in this mode for implementing the invention.
Figure 5:
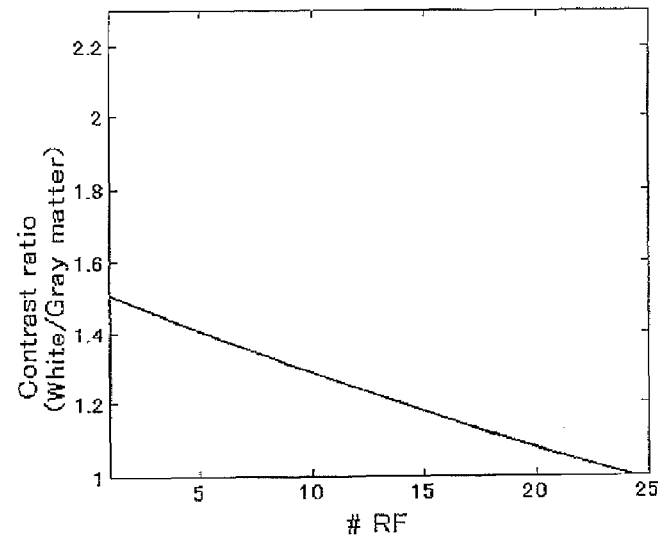

FIGS. 5(A) and 5(B) are diagrams showing the results of simulation performed in this mode for implementing the invention. FIG. 5(A) illustrates a case in which, as noted in this mode for implementation, in executing a scan by the PROPELLER method, the reversed pulse IR is transmitted to the subject and, after the reversal time T1 has elapsed following that transmission, the pulse sequence GR matching the GRE method is executed. On the other hand, FIG. 5(B) shows a case in which, in executing a scan by the PROPELLER method, a pulse sequence matching the FSE method is executed.

Here, a simulation was performed of the contrast ratio between white matter (T1=500 ms, T2=90 ms) and gray matter (T2=940 ms, T2=100 ns) in the human head. More specifically, by transmitting the reversed pulse IR to the subject and, after the reversal time T1 has elapsed following that transmission, executing the pulse sequence GR matching the GRE method as in this mode for implementation, the result shown in FIG. 5(A) was obtained by executing a scan by the PROPELLER method under the conditions of TR=10 ms, a flip angle=20°, T1 (Inversion Time)=1000 ms and RT (Recovery Time)=1000 ms. On the other hand, regarding a case in which a scan by the PROPELLER method was executed in a pulse sequence matching the FSE method under the conditions of TR=800 ms, ETL (Echo Train Length)=16 and ESP (Echo Spacing)=16 ms, the result shown in FIG. 5(B) was obtained. Incidentally in these FIGS. 5(A) and 5(B), the horizontal axis represents the number of echoes (RF#) and the vertical axis, the aforementioned contrast ratio.

As shown in FIG. 5(A), in the case of transmitting the reversed pulse IR to the subject and, after the reversal time T1 has elapsed following that transmission, executing the pulse sequence matching the GRE method, a high contrast was maintained from a small number of echoes to a number of echoes close to the constant state. As a result, in order to generate a T1 emphasized image of 1.4 in contrast ratio, about 50 magnetic resonance signals can be used per blade as shown in FIG. 5(A). On the other hand, as shown in FIG. 5(B), where the pulse sequence matching the FSE method was executed, the contrast ratio was lower than in the case of this mode for implementation, further reduced by the T2 effect. For this reason, in order to obtain a T1 emphasized image of 1.4 in contrast ratio, only about six magnetic resonance signals can be used per blade as shown in FIG. 5(B). In this case, therefore, the number of magnetic resonance signals usable is significantly smaller than in the above-described mode for implementation.

As described so far, many magnetic resonance signals can be collected per blade since a T1-emphasizing contrast is added by transmitting the reversed pulse IR to the subject and, after the reversal time T1 has elapsed, the pulse sequence matching the GRE method, which permits emphasizing of protons, is executed. Therefore, compensation for any bodily movement can be readily made. Furthermore, since magnetic resonance signals can be collected per blade, the length of time required for imaging can be readily reduced. Thus, the robustness of compensation for bodily movements and a saving in imaging time are made possible. Furthermore, since T1 emphasis is mode possible by the transmission of the reversed pulse IR, a highly contrastive T1 emphasized image can be obtained.

Therefore, this mode for implementation, since it realizes high speed data collection and makes possible high image quality, enables the efficiency of diagnosis to be enhanced.

Incidentally, the magnetic resonance imaging apparatus in the above-described mode for implementation corresponds to a magnetic resonance imaging apparatus according to the invention. Further, the scanning unit 2 this mode for implementation corresponds to a scanning unit according to the invention.

Implementation of the invention is not limited to above-described mode for implementation, but various modifications can be adopted.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising a scanning unit which executes a scan to collect magnetic resonance signals from a subject in an imaging space where a magnetostatic field is formed to match a PROPELLER method, the magnetic resonance imaging apparatus generating an image of the subject on the basis of the magnetic resonance signals obtained by the execution of the scan by the scanning unit, wherein:

the scanning unit, in executing the scan by the PROPELLER method, transmits a reversed pulse to the subject when the magnetic resonance signals are to be so collected successively at every repetition time as to match a blade including a plurality of trajectories and successively collects the magnetic resonance signals by executing a pulse sequence matching the GRE method after the time of reversal has elapsed.

2. The magnetic resonance imaging apparatus according to claim 1, wherein:

any bodily movement of the subject is detected on the basis of magnetic resonance signals collected by the scanning unit.

3. The magnetic resonance imaging apparatus according to claim 2, wherein:

any bodily movement of the subject is detected by the execution of the scan by the scanning unit on the basis of each of magnetic resonance signals so collected successively as to match the low frequency region in a k space.

4. The magnetic resonance imaging apparatus according to claim 2, wherein:

the image is corrected on the basis of the result of detection of the bodily movement.

5. The magnetic resonance imaging apparatus according to claim 3, wherein:

the image is corrected on the basis of the result of detection of the bodily movement.

6. The magnetic resonance imaging apparatus according to claim 1, wherein:

a T1 emphasized image is generated as an image of the subject.

7. The magnetic resonance imaging apparatus according to claim 2, wherein:

a T1 emphasized image is generated as an image of the subject.

8. The magnetic resonance imaging apparatus according to claim 3, wherein:

a T1 emphasized image is generated as an image of the subject.

9. The magnetic resonance imaging apparatus according to claim 4, wherein:

a T1 emphasized image is generated as an image of the subject.

10. The magnetic resonance imaging apparatus according to claim 1, further having:

a display unit for displaying the image.

11. A magnetic resonance imaging method comprising the steps of: performing a scan for collecting magnetic resonance signals from a subject in an imaging space where a magnetostatic field is formed to match a PROPELLER method, wherein:

in executing the scan by the PROPELLER method, a reversed pulse is transmitted to the subject when the magnetic resonance signals are to be so collected successively at every repetition time as to match a blade including a plurality of trajectories and the magnetic resonance signals are successively collected by executing a pulse sequence matching the GRE method after the time of reversal has elapsed.

12. The magnetic resonance imaging method according to claim 11, wherein:

any bodily movement of the subject is detected on the basis of the collected magnetic resonance signals.

13. The magnetic resonance imaging method according to claim 12, wherein:

any bodily movement of the subject is detected by the execution of the scan on the basis of each of magnetic resonance signals so collected successively as to match the low frequency region in a k space.

14. The magnetic resonance imaging method according to claim 11, wherein:

the image is corrected on the basis of the result of detection of the bodily movement.

15. The magnetic resonance imaging method according to claim 11, wherein:

a T1 emphasized image is generated as an image of the subject.

16. The magnetic resonance imaging method according to claim 11, wherein:

the image is displayed.

17. A program contained on a computer readable medium which causes a computer to function to execute a scan to collect magnetic resonance signals from a subject in an imaging space where a magnetostatic field is formed to match a PROPELLER method, and to generate an image of the subject on the basis of the magnetic resonance signals obtained by the execution of the scan, wherein:

in executing the scan by the PROPELLER method, a reversed pulse is transmitted to the subject when the magnetic resonance signals are to be so collected successively at every repetition time as to match a blade including a plurality of trajectories and the magnetic resonance signals are successively collected to cause a pulse sequence matching the GRE method to be executed after the time of reversal has elapsed.

18. The program according to claim 17, which causes:

the computer to function to detect any bodily movement of the subject on the basis of the collected magnetic resonance signals.

19. The program according to claim 18, which causes:

the computer to function to detect any bodily movement of the subject by the execution of the scan on the basis of each of magnetic resonance signals so collected successively as to match the low frequency region in a k space.

20. The program according to claim 18, which causes:

the computer to function to correct the image on the basis of the result of detection of the bodily movement.

* * * * *